(12) United States Patent
Labbe

(10) Patent No.: US 9,804,202 B2
(45) Date of Patent: Oct. 31, 2017

(54) CURRENT TRANSDUCER WITH INTEGRATED PRIMARY CONDUCTOR BAR

(71) Applicant: LEM Intellectual Property SA, Fribourg (CH)

(72) Inventor: Arnaud Labbe, St-Girod (FR)

(73) Assignee: LEM Intellectual Property SA, Fribourg (CH)

( * ) Notice: Subject to any disclaimer, the term of this patent is extended or adjusted under 35 U.S.C. 154(b) by 0 days.

(21) Appl. No.: 15/148,975

(22) Filed: May 6, 2016

(65) Prior Publication Data

US 2016/0327593 A1 Nov. 10, 2016

(30) Foreign Application Priority Data

May 9, 2015 (EP) ..................................... 15167049

(51) Int. Cl.
*G01R 15/18* (2006.01)
*G01R 19/00* (2006.01)
(Continued)

(52) U.S. Cl.
CPC ......... *G01R 15/185* (2013.01); *G01R 15/207* (2013.01); *G01R 19/0092* (2013.01); *G01R 31/3696* (2013.01)

(58) Field of Classification Search
CPC .. G01R 15/183; G01R 15/202; G01R 15/207; G01R 15/14; G01R 15/20;
(Continued)

(56) References Cited

U.S. PATENT DOCUMENTS

| 4,882,538 A | 11/1989 | Sato et al. |
| 5,041,780 A | 8/1991 | Rippel |

(Continued)

FOREIGN PATENT DOCUMENTS

WO WO2008/030129 A2 3/2008

OTHER PUBLICATIONS

European Search Report issued by the European Patent Office, dated Dec. 4, 2015, for European Application No. EP15167049.4; 7 pages.

*Primary Examiner* — Thang Le
(74) *Attorney, Agent, or Firm* — Faegre Baker Daniels LLP

(57) ABSTRACT

An electrical current transducer is disclosed which includes a primary conductor bar for carrying the current to be measured, a magnetic core having a magnetic circuit gap, a magnetic field sensor having a magnetic field detector positioned in the magnetic circuit gap, and an insulating housing surrounding the magnetic core and magnetic field sensor. The primary conductor bar has connection terminal ends extending outside of the housing configured for connection to an external primary conductor. The primary conductor bar has a core passage section comprising a fuse portion configured for interruption of the primary conductor if a predefined electrical current is exceeded. The core passage section has a reduced width (W1) in comparison to the connection terminal ends extending outside of the housing thereby providing indents within which at least a portion of the magnetic core is positioned such that a central passage of the magnetic core has a width (W3) less than the width (W2) of the primary conductor connection ends.

12 Claims, 2 Drawing Sheets

(51) Int. Cl.
*G01R 31/36* (2006.01)
*G01R 15/20* (2006.01)

(58) Field of Classification Search
CPC .... G01R 19/0092; G01R 13/02; G01R 21/08; G01R 11/32; G01R 33/18; G01R 33/02; H01L 41/12; H01L 41/16; H02K 41/06
USPC ........ 324/260, 249, 109, 235, 117 R, 117 H, 324/244, 251, 207.12–207.13
See application file for complete search history.

(56) References Cited

U.S. PATENT DOCUMENTS

| | | | | |
|---|---|---|---|---|
| 6,184,679 B1* | 2/2001 | Popovic | ................... | G01R 1/07 |
| | | | | 324/117 H |
| 2009/0295384 A1* | 12/2009 | Teppan | ................ | G01R 15/202 |
| | | | | 324/253 |
| 2013/0113463 A1* | 5/2013 | Fukuyama | ........... | G01R 15/207 |
| | | | | 324/117 R |
| 2014/0084914 A1* | 3/2014 | Nakajima | .............. | G01R 33/09 |
| | | | | 324/252 |
| 2014/0239947 A1* | 8/2014 | Nakajima | .............. | G01R 15/20 |
| | | | | 324/251 |
| 2015/0276814 A1* | 10/2015 | Nakajima | ............ | G01R 15/202 |
| | | | | 324/244 |

\* cited by examiner

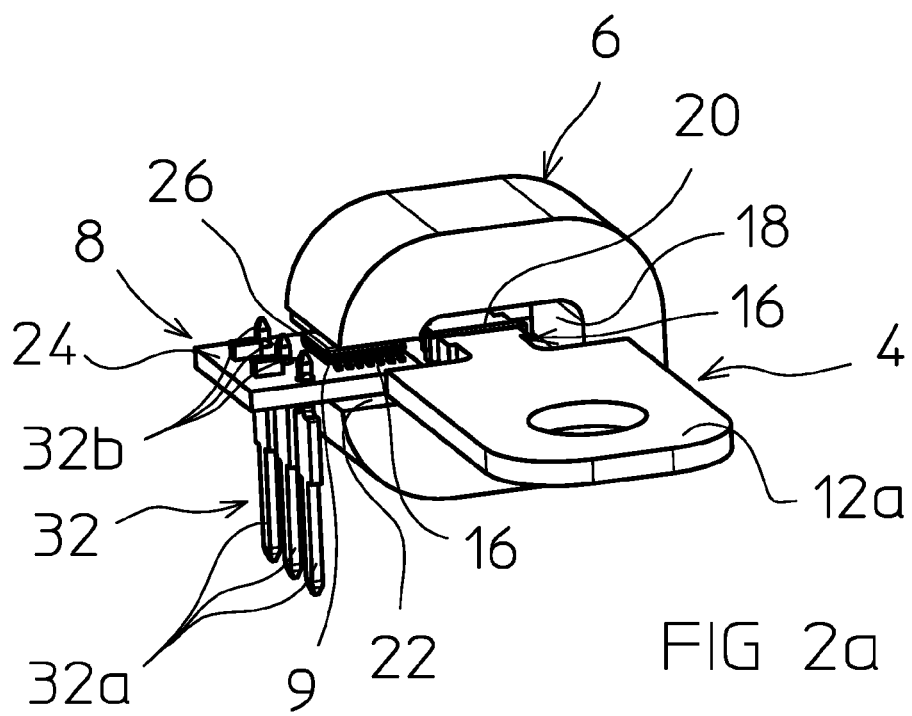
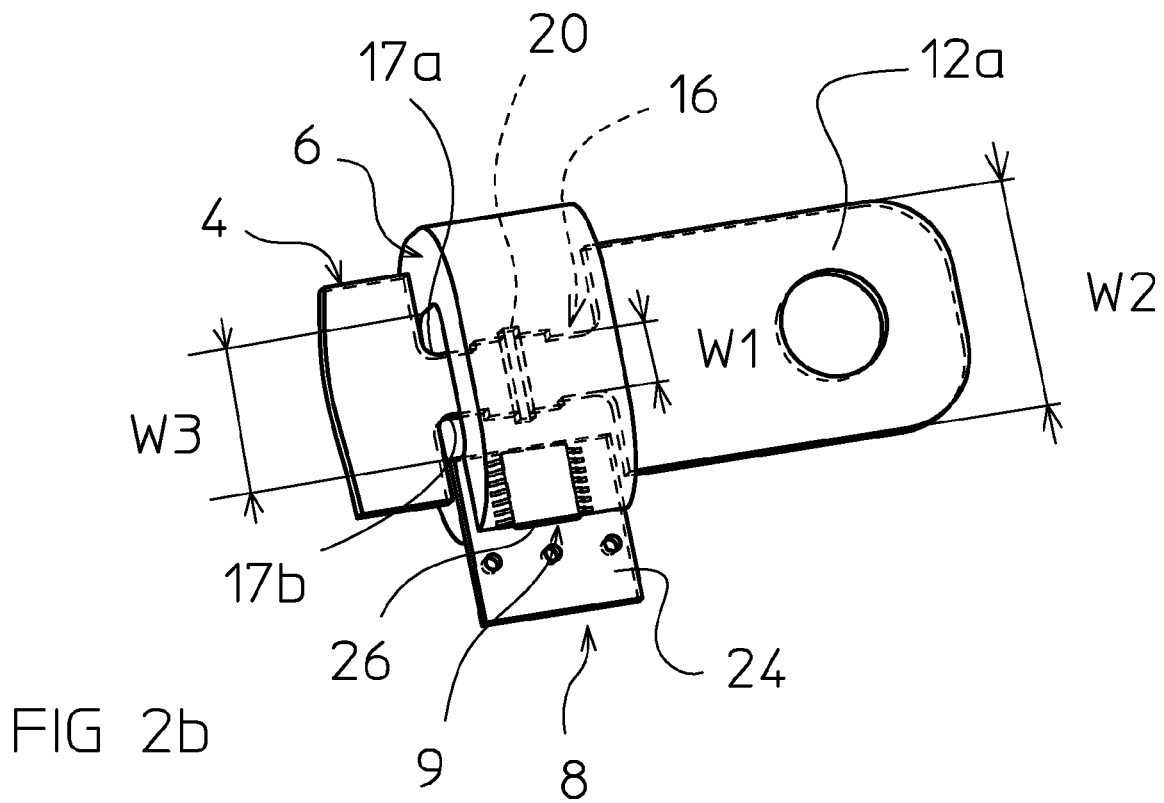

CURRENT TRANSDUCER WITH INTEGRATED PRIMARY CONDUCTOR BAR

This application claims priority from European Patent Application 15167049.4 filed on May 9, 2015, the subject matter of which is incorporated herein by reference.

The present invention relates to an electric current transducer comprising a magnetic core and a magnetic field detector in an air-gap of the magnetic core, for measuring an electrical current flowing in a primary conductor bar extending through a central passage of the magnetic core.

Electrical current transducer modules for current sensing applications typically comprise a magnetic core made of a high permeability magnetic material, surrounding a central aperture through which passes a primary conductor carrying the current to be measured. The magnetic core may typically have a generally rectangular or circular shape and be provided with an air-gap in which a magnetic field detector, such as a Hall effect sensor in the form of an ASIC, is positioned. The magnetic flux generated by the electrical current flowing in the primary conductor is concentrated by the magnetic core and passes through the air-gap. The magnetic field in the air-gap is representative of the primary current.

Electrical current sensors are used in a large variety of applications for monitoring or controlling electrical devices and system and in many applications there is an important advantage in reducing the manufacturing cost of such components and also the costs of implementing and using the components in an electrical circuit. There is often also an important advantage in providing compact components in order to miniaturize and/or reduce the weight of the devices in which the components are mounted.

An object of the invention is to provide an electrical current transducer that is compact and economical to produce, the transducer for measuring a current flowing in a primary conductor that is fused.

It is advantageous to provide an electrical current transducer that is lightweight.

It is advantageous to provide an electrical current transducer that is accurate, easy to implement and economical to use.

It is advantageous to provide an electrical current transducer that is robust and stable.

Disclosed herein is an electrical current transducer including a primary conductor bar for carrying the current to be measured, a magnetic core comprising a magnetic circuit gap, a magnetic field sensor comprising a magnetic field detector positioned in the magnetic circuit gap, and an insulating housing surrounding the magnetic core and magnetic field sensor. The primary conductor bar comprises connection terminal ends extending outside of the housing configured for connection to an external primary conductor. The primary conductor bar comprises a core passage section comprising a fuse portion configured for interruption of the primary conductor if a predefined electrical current is exceeded. The core passage section has a reduced width in comparison to the connection terminal ends extending outside of the housing thereby providing indents within which at least a portion of the magnetic core is positioned such that a central passage of the magnetic core has a width less than the width of the primary conductor connection ends.

In an advantageous embodiment, the magnetic field detector is positioned within an indent of the core passage section of the primary conductor bar.

In an advantageous embodiment, the magnetic field detector comprises a circuit board and the magnetic field detector is mounted on the circuit board.

In an advantageous embodiment, the current transducer further comprises a connector configured for pluggable connection to an external connector, the connector comprising terminals directly mounted and connected to a circuit board of the magnetic field sensor.

In an advantageous embodiment, the magnetic field detector is in a form of an ASIC and comprises a Hall effect cell.

In an advantageous embodiment, the current transducer is an open-loop current transducer.

In an advantageous embodiment, at least one of the connection terminal ends of the primary conductor bar is configured as a crimp connection terminal for crimp connection to an end of an electrical cable.

In an advantageous embodiment, at least one of the connection ends of the primary conductor bar is in a form of a connection terminal for a clamping or bolt connection to a primary conductor.

In an embodiment, the current transducer is configured for connection to a cable for connection to an automotive battery.

In an advantageous embodiment, the magnetic core is formed by winding a Fe—Si tape around a mandrel, fixing start and end of the tape and by cutting or grinding a gap in the tape wound core, possibly after an annealing process.

In a variant, the magnetic core may be formed of a single piece integrally formed ferrite part.

In an advantageous embodiment, the current transducer further comprises an insulating safety cover mounted between the fuse portion and the magnetic core, configured to prevent a short circuit between the primary conductor and the magnetic core in the event of a rupture of the fuse portion.

Further objects and advantageous features of the invention will be apparent from the claims, from the detailed description, and annexed drawings, in which:

FIGS. 2a and 2b are a perspectives views of the embodiment according to FIG. 1b with a housing removed.

Figure 1A:
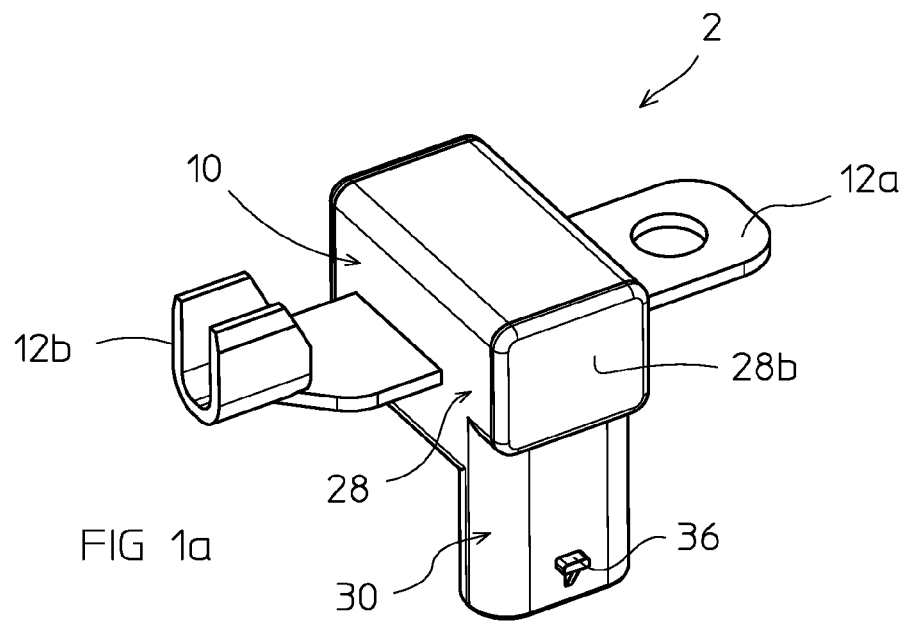
FIG. 1a is a perspective view of an electrical current transducer according to an embodiment of the invention and FIG. 1b is a perspective partially cut away view of the embodiment of FIG. 1b.

Referring to the figures, an exemplary embodiment of an electric current transducer 2 includes a magnetic core 6 comprising a magnetic circuit gap 22, a magnetic field sensor 8 inserted at least partially in the magnetic circuit gap 22, a dielectric housing 10 and a primary conductor bar 4 extending through a central passage 18 of the magnetic core. The primary conductor bar 4 is integrated in the transducer and comprises terminals 12a, 12b at each end for connection to an external primary conductor (not shown) supplying the current to be measured.

In an advantageous embodiment, one of the terminals comprises a connection end 12a for bolted or clamped connection to an external conductor. The external conductor may, in a specific application of the invention, be on a battery connection post, or a power supply line connected to a battery, for instance an automotive battery. In an advantageous embodiment, in particular for automotive applications or for battery installations, one of the terminals may be in the form of a cable connection terminal 12b, for instance a crimp connection terminal as illustrated in FIG. 1a. A current transducer according to the invention may therefor advantageously be crimped on to a power supply cable end for connection to a battery, such as an automotive battery.

In an embodiment, the magnetic field sensor 8 may advantageously comprise a circuit board 24 and a magnetic field detector 9 that may for example be provided in the form of an ASIC (Application Specific Integrated Circuit) 26 comprising electrical terminals 16 for connection to the circuit board. In an embodiment, the magnetic field detector 9 may comprise a Hall effect sensor, per se well known in the art, or may be based on other magnetic field sensing technologies such as magneto-resistive or fluxgate sensors that are also well known in the art. Hall cell magnetic field detectors are widely used in open-loop current sensing applications because of their low cost and good measurement performance in open-loop applications.

The circuit board 24 comprises circuit traces and various circuit components that may perform some processing of the measurement signal and power supply between the magnetic field detector and electrical terminals 32 connected to the external circuitry (not shown) for power supply and measurement signal transmission. Each terminal comprises a circuit board connection end 32b, for instance in a form of a pin terminal inserted through a plated through-hole in the circuit board 24, or in the form of other circuit board connection means that are per se well known the art. The terminals 32 further comprise external connection ends 32a, for instance in a form of pin or tab terminals, positioned within and surrounded by a connector shroud 30 configured for pluggable coupling to a complementary external connector that's supplies power and transmits the measurement signal to external circuitry (not shown).

The connector shroud 30 may comprise various fixing means such as a latching protrusion or element 36 for locking the complementary connector thereto. In a specific advantageous application for the present invention, the transducer may thus be crimped on to the end of a power supply cable on one end of the primary conductor bar 4 and bolted or clamped on to a battery connection terminal on the other end of the primary conductor bar, the current measurement signal being connected to the transducer by means of an external pluggable connector.

Magnetic flux generated by the primary conductor circulates in the magnetic core 6 and is picked up by the magnetic field detector 9 positioned in the magnetic circuit gap 22. The magnetic core 6 is preferably a cut tape wound core, per se well known in the art but may also be made of other materials such as stacked laminated sheets of magnetic material that are also per se well known in the art or may be a ferrite core.

The primary conductor bar 4 comprises a core passage section 16 extending between the connection terminals 12a, 12b. The core passage section 16 has a width W1 that is smaller than the width W2 of the primary conductor bar 4 outside of the central passage 18 of the core 6. The width of the material of the primary conductor bar 4 at the connection ends 12a, 12b is generally wider than the core passage section 16. The core passage section 16 thus provides indents 17a, 17b allowing the magnetic core 6 to surround the core passage section 16 with the material of the magnetic core being positioned within the indents 17a, 17b of the primary conductor bar 4. This allows the primary conductor bar to have a relatively large cross section or connection surface area for adequate connection to the primary conductor in view of the current to be carried, while allowing the transducer to have a compact size and improved performance.

In the core passage section 16 of the primary conductor bar 4 is further provided a fuse portion 20. The fuse portion 20 is configured to interrupt current conduction between the connection ends 12a, 12b in a situation where the electrical current exceeds predefined levels. Various fuse materials and configurations may be implemented in the fuse portion 20, as is per se well known in the art of current fuses, provided that the width of the fuse portion 20 is smaller than the width of the central passage 18 of the magnetic core 6. In an embodiment of the invention, the fuse portion 20 is a fuse that melts when a primary current exceeds the maximum allowed current as a function of time. Advantageously, current fuses in many configurations have a conducting cross-section that is smaller than the cross-section of the conductor that is being fused in order to melt or rupture in the zone of the fuse. The position of magnetic core 6 around the fuse portion 20 thus allows the magnetic core to have a smaller circumference surrounding the primary conductor bar and further allows the magnetic field detector 9 to be inserted in the magnetic circuit gap 22 while being positioned within the indent 17b formed by the reduced width core passage section 16 of the primary conductor bar 4.

The dielectric housing 10 may be made of two or more housing parts that are assembled together around the magnetic core and magnetic field sensor, provided with orifices through lateral side walls to allow the primary conductor connection ends 12a, 12b to extend therethrough.

Figure 1B:
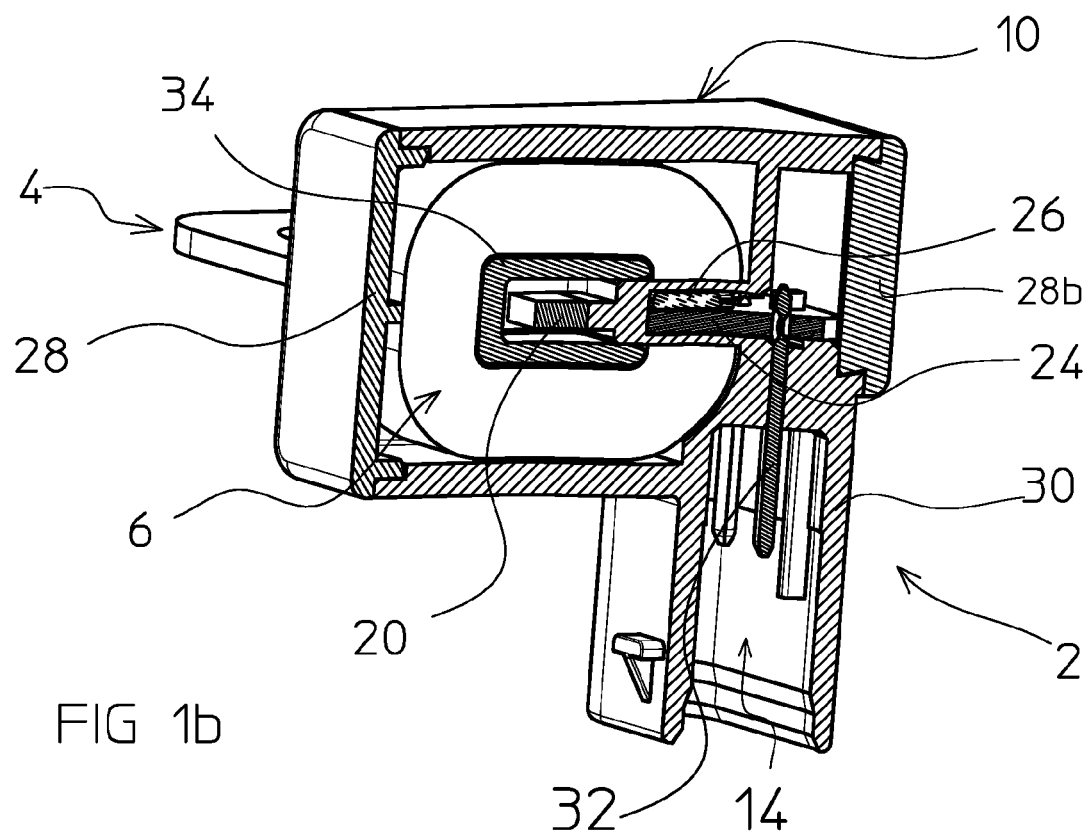

A safety cover 34 made of an insulating material, for instance plastic, may advantageously be positioned between the inner side of the magnetic core 6 and the fuse portion 20 as best seen in FIG. 1b. The safety cover prevents molten material of a fuse portion, in an event of rupture of the fuse portion, from flowing into contact with the magnetic core, thus avoiding the risk of short circuiting the primary conductor through the magnetic core 6. The safety cover 34 may for instance be in the form of a plastic cap clipped around the fuse portion 20 prior to insertion in the central passage 18 of the magnetic core, or a plastic lining part mounted against the inner side of the magnetic core surrounding the central passage 18.

The invention claimed is:

1. An electrical current transducer comprising a primary conductor bar for carrying the current to be measured, a magnetic core having a magnetic circuit gap, a magnetic field sensor having a magnetic field detector positioned in the magnetic circuit gap, and an insulting housing surrounding the magnetic core and the magnetic field sensor, wherein the primary conductor bar comprising connection terminal ends extending outside of the insulating housing configured for connection terminal ends extending outside of the insulating housing configured for connection to an external primary conductor, the primary conductor bar further comprises a core passage section which includes a fuse portion configured for interruption of the primary conductor if a predefined electrical current is exceeded, the core passage section having a reduced width (W1) in comparison to the connection terminal ends extending outside of the insulating housing thereby providing indents within which at least a portion of the magnetic core is positioned such that a central passage of the magnetic core has a width (W3) less than a width (W2) of the connection terminal ends of the primary conductor bar.

2. The electrical current transducer according to claim 1, wherein the magnetic field detector is positioned within an indent of the core passage section of the primary conductor bar.

3. The electrical current transducer according to claim 1, wherein the magnetic field detector comprises a circuit board and the magnetic field detector is mounted on the circuit board.

4. The electrical current transducer according to claim 1 further comprising a connector configured for pluggable connection to an external connector, the connector comprising terminals directly mounted and connected to a circuit board of the magnetic field sensor.

5. The electrical current transducer according to claim 4, wherein the magnetic field detector is in a form of an ASIC and comprises a Hall effect cell.

6. The electrical current transducer according to claim 1, wherein the current transducer is an open-loop current transducer.

7. The electrical current transducer according to claim 6, wherein at least one of the connection terminal ends of the primary conductor bar is configured as a crimp connection terminal for crimp connection to an end of an electrical cable.

8. The electrical current transducer according to claim 1, wherein at least one of the connection terminal ends of the primary conductor bar is in a form of a connection terminal for a clamping or a bolt connection to the external primary conductor.

9. The electrical current transducer according to claim 1, wherein the current transducer is configured for connection to a cable for connection to an automotive battery.

10. The electrical current transducer according to any of the preceding claims, wherein the magnetic core is a gapped tape wound core.

11. The electrical current transducer according to claim 1, wherein the magnetic core is a single piece integrally formed ferrite part.

12. The electrical current transducer according to claim 1, further comprising an insulating safety cover mounted between the fuse portion and the magnetic core.

* * * * *